(12) United States Patent

He et al.

(10) Patent No.: US 6,716,698 B1
(45) Date of Patent: Apr. 6, 2004

(54) VIRTUAL GROUND SILICIDE BIT LINE PROCESS FOR FLOATING GATE FLASH MEMORY

(75) Inventors: Yue-song He, San Jose, CA (US); Richard Fastow, Cupertino, CA (US); Wei Zheng, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/238,412

(22) Filed: Sep. 10, 2002

(51) Int. Cl.$^7$ ............................................. H01L 21/336
(52) U.S. Cl. ....................... 438/257; 438/259; 438/260; 257/315; 257/316; 257/321; 257/322; 365/185; 365/189.01; 365/222
(58) Field of Search .................................. 438/257, 259, 438/260; 365/185, 222, 189.01; 257/315, 316, 321, 322

(56) References Cited

U.S. PATENT DOCUMENTS

| | | | |
|---|---|---|---|
| 5,204,835 A | * 4/1993 | Eitan | 365/185 |
| 5,464,999 A | * 11/1995 | Bergemont | 257/322 |
| 5,907,781 A | 5/1999 | Chen et al. | |
| 5,976,924 A | 11/1999 | Gardner et al. | |
| 5,978,272 A | 11/1999 | Fang et al. | |
| 6,140,167 A | 10/2000 | Gardner et al. | |
| 6,300,194 B1 | 10/2001 | Locati et al. | |
| 6,319,807 B1 | 11/2001 | Yeh et al. | |
| 6,326,251 B1 | 12/2001 | Gardner et al. | |
| 6,339,245 B1 | 1/2002 | Maa et al. | |

* cited by examiner

Primary Examiner—David Nelms
Assistant Examiner—Reneé R Berry
(74) Attorney, Agent, or Firm—Eschweiler & Associates, LLC

(57) ABSTRACT

One aspect of the invention relates to a virtual ground array floating gate flash memory device with salicided buried bit lines. The bit lines are implanted and salicided after formation of memory cell stacks, but before formation of word lines. The salicide can form over control gates for the memory cells and can contact a third poly layer from which the word lines are patterned. According to another aspect of the invention, an interpoly dielectric coats the sides of the floating gates and significantly improves the capacitance between the floating gate and the memory cell channel. The present invention provides very compact and reliable nonvolatile memory.

13 Claims, 7 Drawing Sheets

VIRTUAL GROUND SILICIDE BIT LINE PROCESS FOR FLOATING GATE FLASH MEMORY

TECHNICAL FIELD OF THE INVENTION

The present invention relates generally to semiconductor devices and more particularly to flash memory devices.

BACKGROUND OF THE INVENTION

There has long been a demand for small, portable personal devices. These devices include cellular phones, personal computing equipment, and personal sound systems, which are sought in continuously smaller sizes and with continuously lower power requirements. At the same time that smaller and more portable devices are sought, computational power and on-chip memory requirements are increasing. In light of these requirements, there has been a long-felt need for computational devices that have substantial memory and logic functions integrated within individual semiconductor chips. Preferably, the memory is configured such that if power is interrupted, as when a battery fails, the contents of the memory are retained. Memory that retains its content without a continuous supply of power is called non-volatile memory. Non-volatile memory types include, for example, electrically erasable, programmable read only memory (EEPROM) and flash EEPROM.

The term "flash" refers to the ability of the memory to be erased in blocks. Flash memory devices typically store electrical charges, representing data, in transistors having either a floating-gate or a charge-trapping dielectric. The stored charges affect the threshold voltage of the transistors. For example, in an n-channel floating-gate transistor an accumulation of electrons in the floating-gate electrode creates a high threshold voltage in the transistor. The presence or absence of the stored charge can be determined by whether current flows between a source region and a drain region of the transistor when appropriate voltages are applied to the control gate, source, and drain.

Various structures have been proposed for making flash memory devices. Prior art FIG. 1 illustrates a conventional NOR configuration 10, wherein the control gate 11 is connected to a word line (e.g., WL0 thru WL3) associated with a row of such cells 12 to form sectors of such cells. In addition, the drain regions 13 of the cells are connected together by a conductive bit line (e.g., BL0 thru BL3). The channel of the cell conducts current between the source 14 and the drain 13 in accordance with an electric field developed in the channel by the stacked gate structure. In the NOR configuration, each drain terminal 13 of the transistors 12 within a single column is connected to the same bit line. In addition, each flash cell 12 associated with a given bit line has its stacked gate terminal 11 coupled to a different word line (e.g., WL1 thru WL4), while all the flash cells in the array have their source terminals 14 coupled to a common source terminal (CS). In operation, individual flash cells 12 are addressed via the respective bit line and word line using peripheral decoder and control circuitry for programming (writing), reading or erasing functions.

In addition to the NOR configuration, some prior art flash memories use a "virtual ground" architecture, as shown in FIG. 2. A typical virtual ground architecture 20 comprises rows 24 of flash cells 21 with its stacked gate terminal 30 coupled to an associated word line (e.g., $WL_0$ thru $WL_n$) 24, and columns (26, 27, 28, 29) of flash cell pairs (21 & 23) with a drain 32 of one transistor 23 coupled to an associated bit line (e.g., $BL_0$ thru $BL_m$) and the source 22 of the adjacent transistor 21 coupled to the same bit line 27. In addition, each single row of flash cells (e.g., 21 & 23) associated with a word line 24 is connected in series, with the source 22 of one cell 21 coupled to the drain 32 of an adjacent cell 23, wherein each drain terminal of the transistors within a single column is connected to the same bit line.

An individual flash cell is selected via the word line and a pair of bit lines bounding the associated cell. For example, in reading the flash cell 21, a conduction path would be established when a positive voltage is applied to the bit line ($BL_0$) 26 coupled to the drain of flash cell 21, and the source 22 which is coupled to the bit line ($BL_1$) 27, is selectively coupled to ground ($V_{SS}$). Thus, a virtual ground is formed by selectively switching to ground the bit line associated with the source terminal of only those selected flash cells which are to be programmed or read.

As can be seen from the above, while a non-virtual ground array structure has dedicated source and drain regions for reading and writing operations, a virtual ground array structure reduces the spacing between cells by employing dual purpose bit lines that can serve as either sources or drains according to the voltages applied.

Myriad approaches have been proposed for making flash memory devices more compact. These approaches include improved processing techniques to produce smaller cells, improved materials that lend themselves to smaller cell sizes, and improved architectures that use space more efficiently. Nonetheless, there remains a long felt need for more compact flash memory devices.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

One aspect of the invention relates to a virtual ground array floating gate flash memory device with salicided buried bit lines. The bit lines are implanted and salicided after formation of memory cell stacks, but before formation of word lines that connect memory cell control gates. Saliciding bit lines enables the use of narrower bit lines, fewer bit line contacts, and a shallower source/drain implant, all of which facilitate the formation of compact memory. Saliciding memory cell control gates facilitates contact with word lines.

According to another aspect of the invention, the control gate layer is relatively thin, for example, no more than about 500 Angstroms. Having a thin control gate layer improves the aspect ratio for the etch that defines the bit lines and facilitate the formation of compact memory.

A further aspect of the invention relates to a process for forming virtual ground array floating gate flash memory devices in which the floating gates are patterned prior to depositing an interpoly dielectric. In this process, the interpoly dielectric coats the sides of the floating gates and significantly improves the capacitance between the floating gates and the memory cell channels.

Other advantages and novel features of the invention will become apparent from the following detailed description of the invention and the accompanying drawings. The detailed description of the invention and drawings provide exemplary embodiments of the invention. These exemplary embodiments are indicative of but a few of the various ways in which the principles of the invention can be employed.

DETAILED DESCRIPTION OF THE INVENTION

Figure 1:
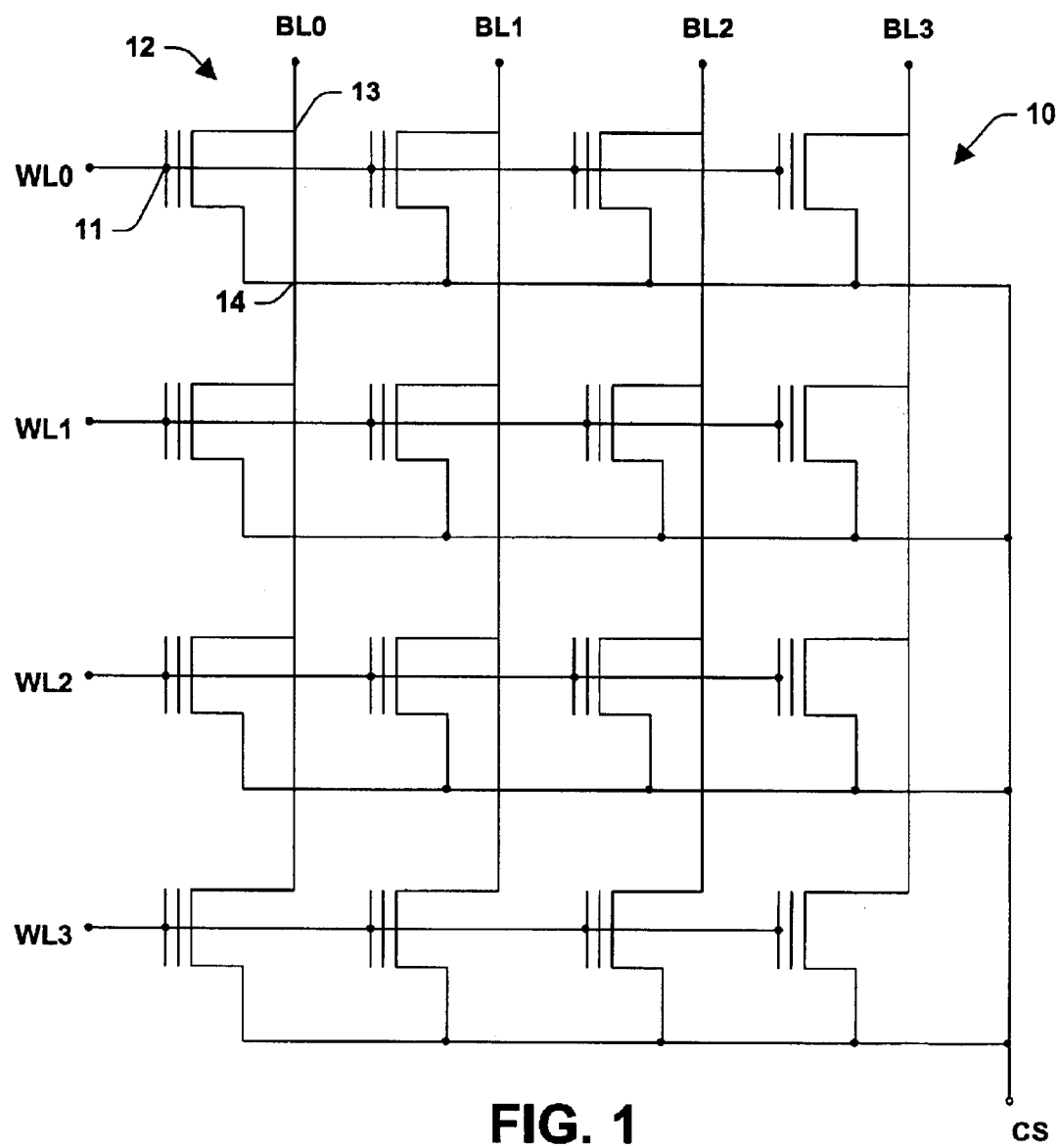
FIG. 1 is a schematic diagram which illustrates a conventional NOR flash memory architecture.
Figure 2:
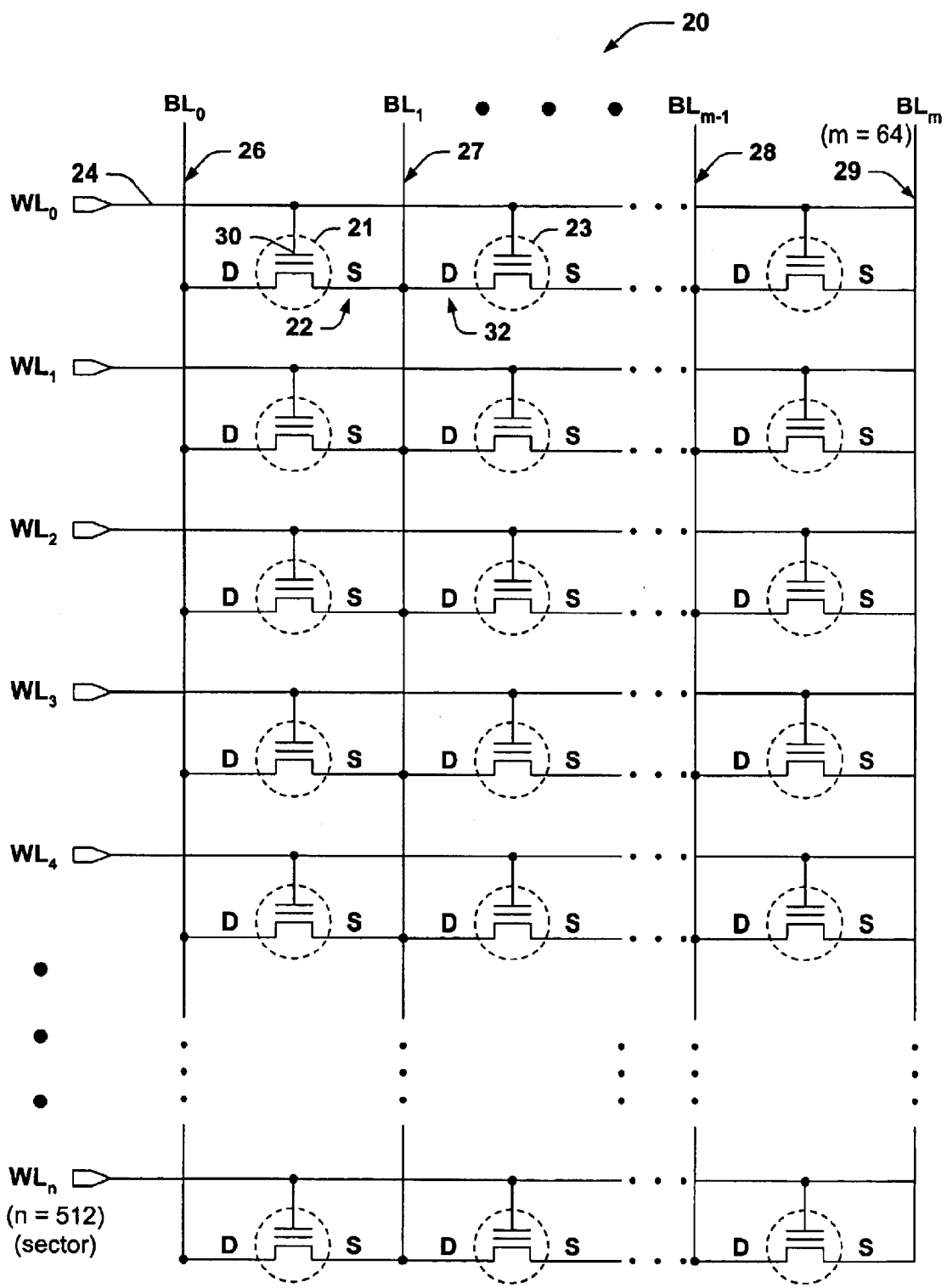
FIG. 2 is a schematic diagram which illustrates a conventional virtual ground flash memory array.

The present invention will now be described with reference to the drawings, wherein like reference numerals are used to refer to like elements throughout.

Figure 3:
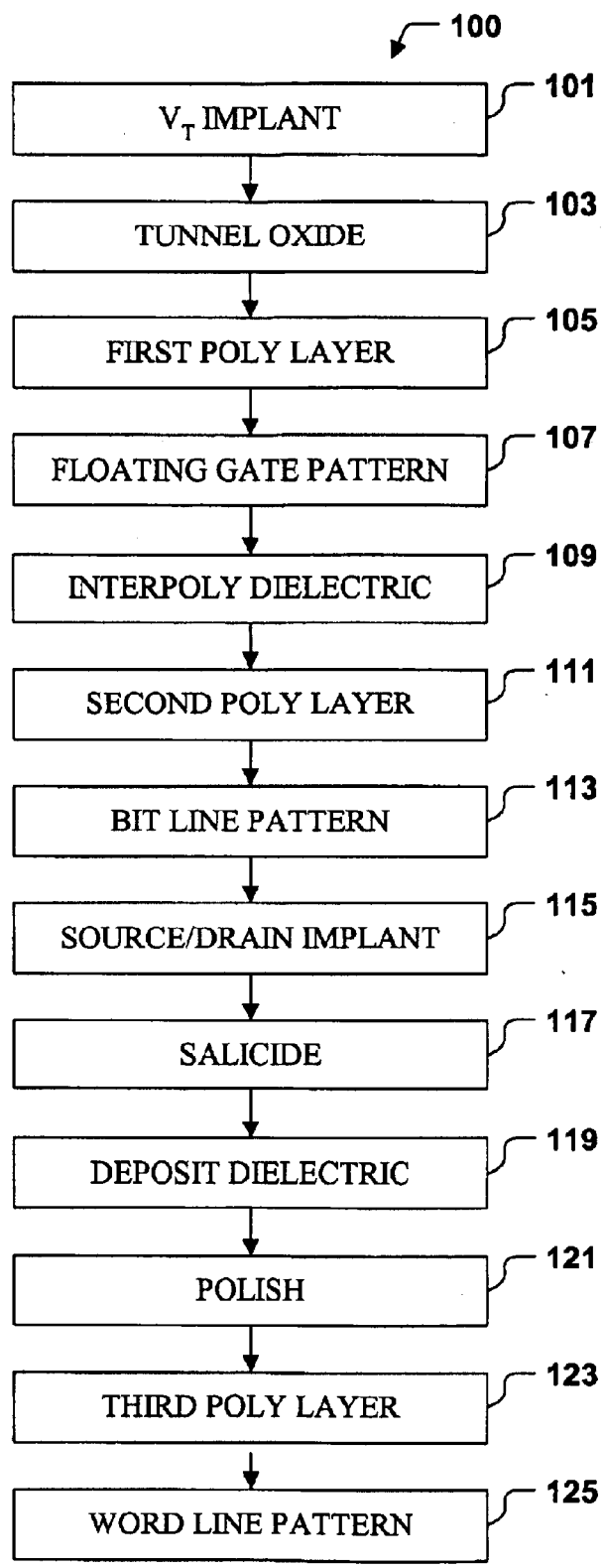
FIG. 3 is a flow chart of a process according to one aspect of the present invention.

FIG. 3 is a flow chart illustrating pertinent acts in an exemplary process 100 for forming a virtual ground array floating gate flash memory device according to one aspect of the present invention. While the exemplary method 100 is illustrated and described herein as a series of acts or events, it will be appreciated that the present invention is not limited by the illustrated ordering of such acts or events, as some steps may occur in different orders arid/or concurrently with other steps apart from that shown and described herein, in accordance with the invention. In addition, not all illustrated steps may be required to implement a methodology in accordance with the present invention. Moreover, it will be appreciated that the method 100 may be implemented in association with the architecture illustrated and described herein as well as in association with other architectures not illustrated.

The acts of method 100 comprise implanting a core region of a semiconductor substrate to set a threshold voltage, $V_T$, act 101, forming a tunnel oxide layer in the core region, act 103, forming a first poly layer over the tunnel oxide, act 105, and patterning the first poly layer to form isolated floating gates, act 107. The process 100 further comprises forming an interpoly dielectric layer over the floating gates, act 109, forming a second poly layer over the interpoly dielectric layer, act 111, and patterning the second poly layer and other layers as necessary to expose the semiconductor substrate where bit lines are desired, act 113. Lastly, the process 100 comprises implanting the substrate to form bit lines, act 115, saliciding, act 117, depositing a dielectric over the core region, act 119, polishing, act 121, forming a third poly layer over the dielectric and the second poly layer, act 123, and patterning the second and third poly layers to form control gates and word lines, act 125.

Referring to the process 100 in greater detail, act 101 sets the threshold voltage in the core region of the semiconductor substrate. Act 101 is optional if a $V_T$ adjust is not needed or desired. The semiconductor substrate includes a core region, where memory cells are to be formed, and a peripheral regions that will contain control circuitry for the memory cells and optionally other devices as well. The substrate includes a semiconductor, such as silicon. Other examples of semiconductors include GaAs and InP. In addition to a semiconductor, the substrate may include various elements and/or layers. These can include metal layers, barrier layers, dielectric layers, device structures, active elements and passive elements including silicon gates, word lines, source regions, drain regions, bit lines, bases emitters, collectors, conductive lines, conductive vias, etc. The core region can be provided with isolation regions, but these are not generally necessary in a virtual ground memory device made according to process 100.

The threshold voltage implant generally involves irradiating the semiconductor to implant ions of a first conductivity type. A sacrificial oxide layer may be provided over the semiconductor prior to the threshold voltage implant to reduce damage to the semiconductor surface.

Act 103 of FIG. 3 forms a tunnel oxide and generally follows act 101, the threshold voltage implant, although the order of these acts can be reversed. The tunnel oxide is generally formed by heating the substrate in an oxidizing atmosphere. The thickness of the tunnel oxide depends in part on the size of the memory cells being formed, the thickness being less when smaller memory cells are desired. In one embodiment, the tunnel oxide is about 30 Å to about 150 Å thick. In another embodiment, the tunnel oxide is about 80 Å to about 120 Å thick. In a further embodiment, the tunnel oxide is about 100 Å thick.

The term tunnel oxide has a functional definition according to its role in a floating gate memory cell. Generally a tunnel oxide is an oxide formed by oxidizing the semiconductor surface, especially a silicon semiconductor surface. However, in a further embodiment, the tunnel oxide comprises a high-k dielectric. High-k dielectrics can be provided in greater thickness than silicon dioxide while providing a given capacitance. High-k dielectrics are employed to avoid difficulties associated with very thin films, such as the difficulty of providing a very thin film with uniform thickness. Examples of high-k dielectrics include silicates, aluminates, titanates, and metal oxides. Examples of silicate high-k dielectrics include silicates of Ta, Al, Ti, Zr, Y, La and Hf, including Zr and Hf doped silicon oxides and silicon oxynitrides. Examples of aluminates include transition metal aluminates, such as compounds of Zr and Hf. Examples of titanate high-k dielectrics include $BaTiO_3$, $SrTiO_3$, and $PdZrTiO_3$. Examples of metal oxide high-k dielectrics include oxides of refractory metals, such as Zr and Hf, and oxides of Lanthanide series metals, such as La, Lu, Eu, Pr, Nd, Gd, and Dy. Additional examples of metal oxide high-k dielectrics include $Al_2O_3$, $TiO_2$, $Ta_2O_5$, $Nb_2O_5$ and $Y_2O_3$.

Act 105 forms a first poly layer over the tunnel oxide formed in act 103. The term poly is inclusive of amorphous silicon and polysilicon. Generally, amorphous silicon is deposited and subsequently annealed to form polysilicon. The first poly layer provides the floating gates. In one embodiment, the first poly layer has a thickness of about 300 Å to about 1,200 Å. In another embodiment, the first poly layer has a thickness of about 400 Å to about 800 Å. In a further embodiment, the first poly layer has a thickness of about 500 Å.

Figure 4:
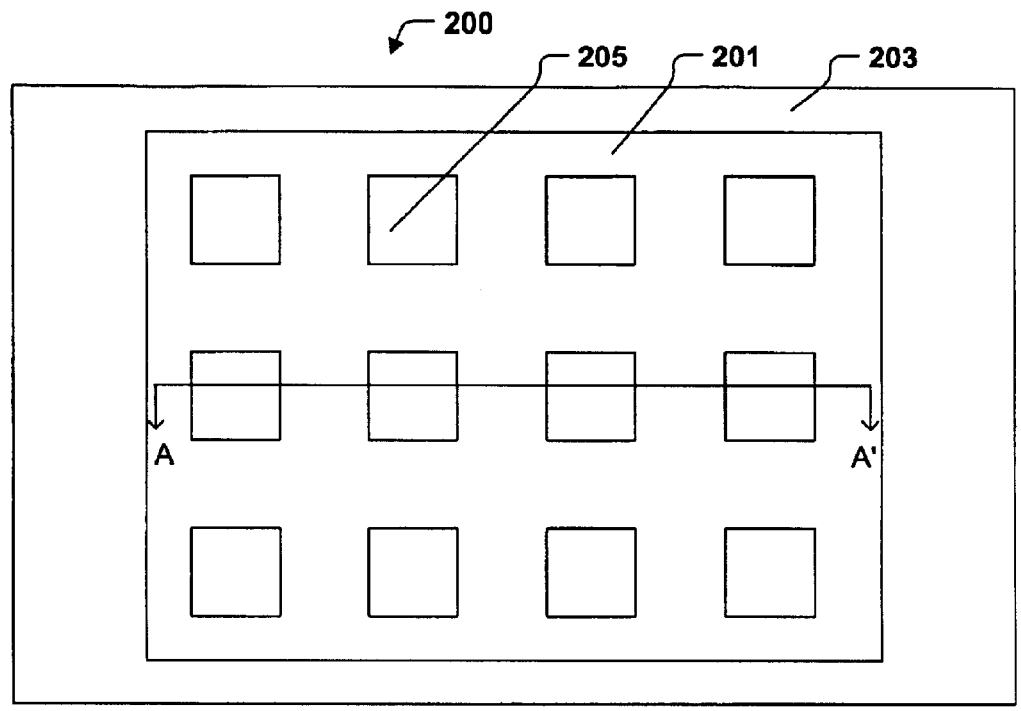
FIG. 4 is a schematic illustration of a semiconductor substrate on which floating gates have been formed and patterned.
Figure 5:
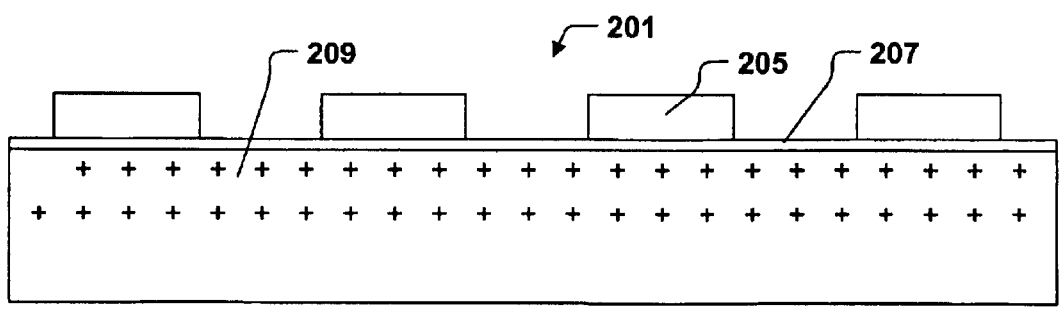
FIG. 5 is a cross-sectional schematic illustration of FIG. 4's core region.

Act 107 patterns the first poly layer to isolate the floating gates of various memory cells from one another. Patterning is generally carried out by a lithographic process. FIG. 4 provides a top or plan view illustration of an exemplary device 200 having undergone process 100 through act 107. The device 200 includes a core region 201, a peripheral region 203, and floating gates 205 which are patterned to form square portions in the present example. FIG. 5 provides a cross-sectional schematic illustration of the core region 201 along the line A–A'. FIG. 5 illustrates the semiconductor substrate 209 with doping provided by act 101, tunnel oxide 207 formed by act 103, and the floating gates 205 formed by act 105 and patterned by act 107.

Figure 6:
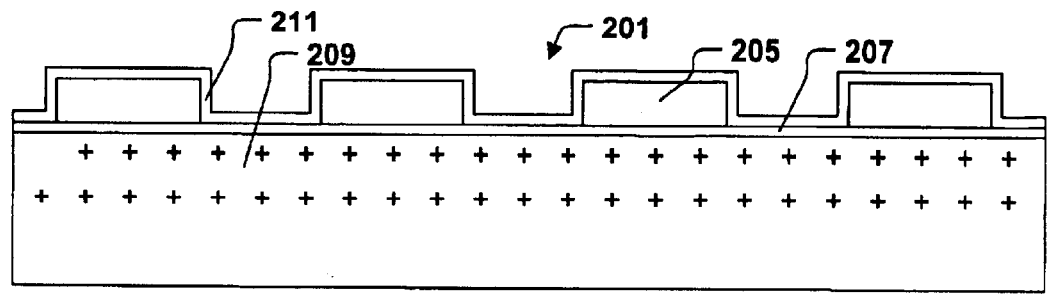
FIG. 6 is a cross-sectional schematic illustration of FIG. 4's cor region after formation of an interpoly dielectric layer.

Act 109 forms an interpoly dielectric over the floating gates. The interpoly dielectric can include multiple layers such as silicon oxide layers, silicon oxynitride layers, and silicon nitride layers. Generally an ONO trilayer interpoly dielectric is provided. In one embodiment, the interpoly dielectric is from about 100 Å to about 300 Å thick. FIG. 6 provides a cross-sectional schematic illustration of the core region 201 after deposition of an interpoly dielectric 211.

As illustrated by FIG. 6, process 100 can provide a virtual ground array floating gate flash memory device in which the interpoly dielectric 211 covers the tops and sides of the floating gates 205 because the floating gates have been fully patterned. Spacers can also be formed on the sidewalls of the floating gates 205 but are not generally necessary. The interpoly dielectric 211 advantageously contributes to the capacitance between floating gates 205 and control gates subsequently formed thereover.

By patterning the floating gates 205 completely (e.g., as in the grid arrangement of FIG. 4), the interpoly dielectric 211 completely covers the top and sidewalls of the floating gates, thereby substantially improving the coupling ratio of the cells. The coupling ratio of a stacked gate type memory cell is a ratio of terminal voltage that gets coupled to the floating gate. Therefore, the control gate coupling ratio (GCR) gives an indication of how well a voltage applied to the control gate gets coupled to the floating gate. In other words:

$$\Delta V_{FG} = \Delta V_{CG} \times GCR.$$

By improving the coupling ratio, less control gate voltage is needed to effectuate programming and erasure of the cells, thereby allowing lower program and erase voltages to be employed. Due to the increased capacitance provided by the interpoly dielectric 211 completely surrounding the top and sidewalls of the floating gates 205, the coupling ratio of the present invention was found to increase about 10–20%.

Referring again to FIG. 3, act 111 forms a second poly layer over the interpoly dielectric. The second poly layer will provide control gates for the memory cells. The thickness of the second poly layer is preferably kept small to limit the height of the memory cell stacks. In one embodiment, the second poly layer is from about 100 Å to about 600 Å thick. In another embodiment, the second poly layer is from about 200 Å to about 400 Å thick. In a further embodiment, the second poly layer is about 300 Å thick. The thickness of the second poly layer of the present invention is substantially thinner than prior art devices in which the second poly layer is typically about 2,000 Å.

Figure 7:
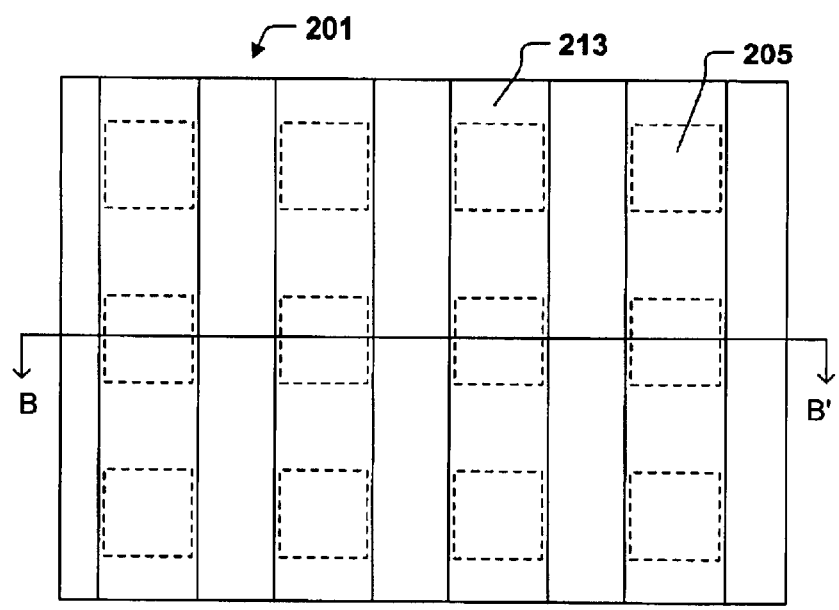
FIG. 7 a schematic illustration of the substrate of FIG. 4 after patterning to expose the substrate where bit lines are desired.
Figure 8:
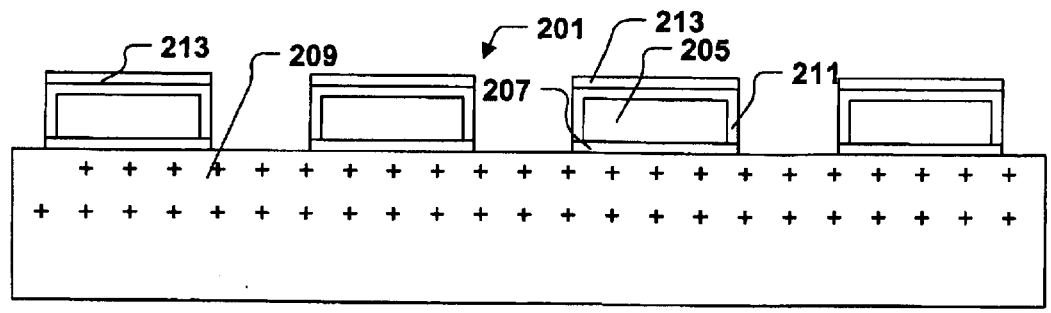
FIG. 8 is a cross-sectional schematic illustration of FIG. 7's core region.

Act 113 patterns the second poly layer and removes other portions of the memory cell stacks to expose the semiconductor substrate where bit lines are desired. As illustrated in FIG. 7, a second poly layer 213 is generally patterned into columns that cover the floating gates 205. FIG. 8 provides a cross-sectional schematic illustration showing the floating gates 205 surrounded by the interpoly dielectric 211 and the tunnel oxide 207 taken along B–B' of FIG. 7.

Preferably, the bit lines are narrow and the lengths of the channels between the bit lines are also narrow. In one embodiment, the bit lines are from about 0.09 to about 0.25 µm wide. In another embodiment, the bit lines are from about 0.1 to about 0.20 µm wide. In a further embodiment, the bit lines are from about 0.13 to about 0.15 µm wide. In one embodiment, the channels are from about 0.11 to about 0.27 µm long. In another embodiment, the channels are from about 0.13 to about 0.22 µm long. In a further embodiment, the channels are from about 0.15 to about 0.17 µm long. A thin second poly layer reduces the aspect ratio of the memory cell stacks and facilitates patterning to form narrow bit lines and short channels.

Figure 9:
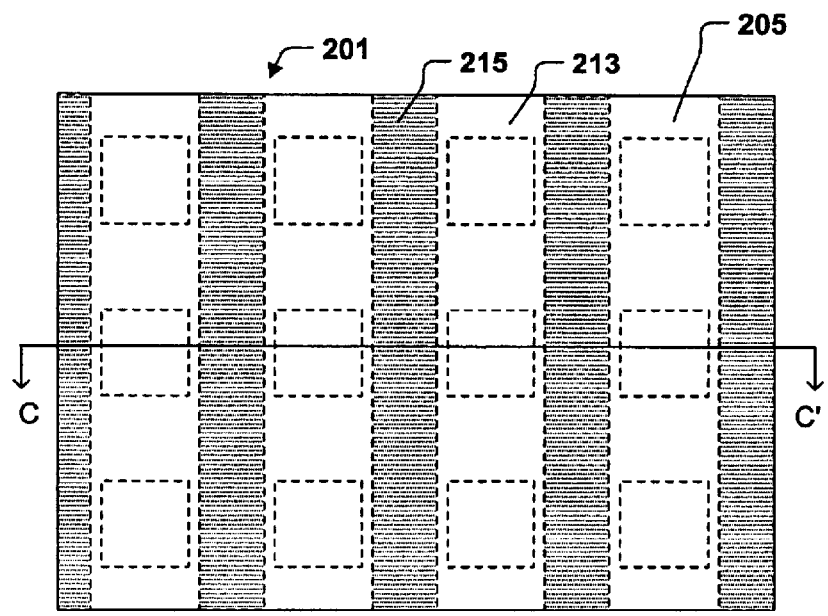
FIG. 9 a schematic illustration of the substrate of FIG. 7 after a source/drain implant.
Figure 10:
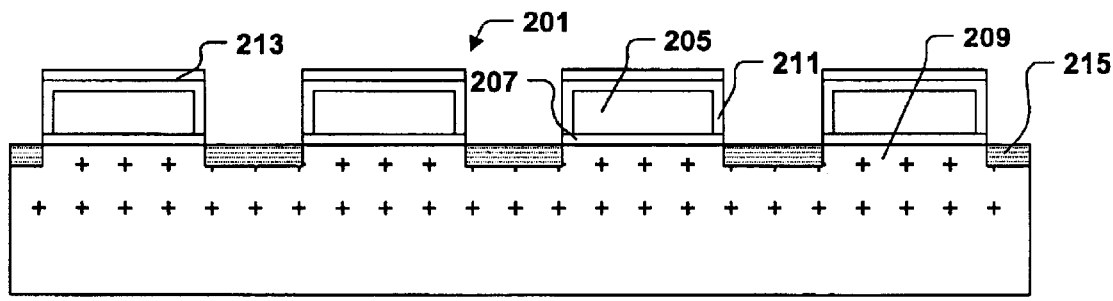
FIG. 10 is a cross-sectional schematic illustration of FIG. 9's core region.

Act 115 implants the source/drain regions and forms the bit lines. Because the bit lines will be salicided, a shallow source/drain implant can be employed, thus mitigating short channel effects. The source/drain implant primarily serves to reverse the conductivity type of the source/drain regions from that of the substrate or well in which they are formed. In one embodiment, the source drain implant provides from about $1 \times 10^{13}$ atoms/cm$^3$ to about $3 \times 10^{15}$ atoms/cm$^3$. In another embodiment, it provides from about $3 \times 10^{13}$ atoms/cm$^3$ to about $5 \times 10^{14}$ atoms/cm$^3$. In a further embodiment, it provides about $1 \times 10^{14}$ atoms/cm$^3$. Preferably the implant is carried out at an energy level no greater than about 60 keV, more preferably no greater than about 50 keV, and still more preferably no greater than about 40 keV. FIGS. 9 and 10 illustrate the core region 201 after implanting bit lines 215, which serve as dual-function source/drain regions for the memory cells, wherein FIG. 10 is a cross section of FIG. 9 taken along line C–C'.

Figure 11:
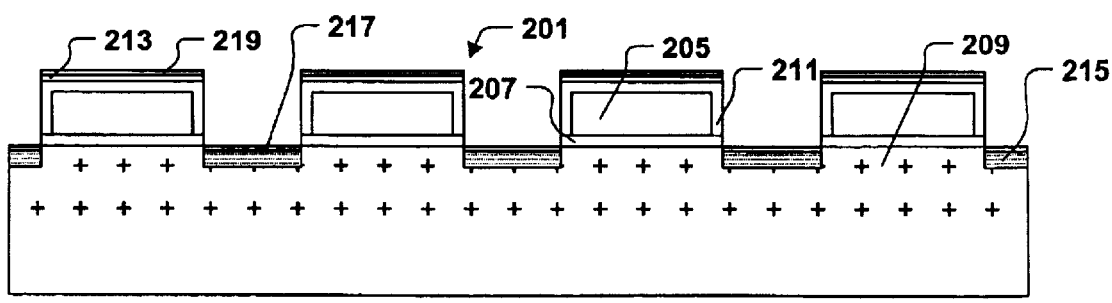
FIG. 11 is a cross-sectional schematic illustration of FIG. 9's core region after saliciding.

Act 117 salicides the bit lines. Preferably, act 117 also salicides the second poly layer. FIG. 11 illustrates the core region 201 with the bit lines 215 having a salicided portion 217 and the second poly layer 213 having a salicided portion 219. Saliciding refers to a self-aligned silicide process. A typical silicide process begins by providing a coating of a metal. The metal can be coated by any suitable method, including, for example, evaporation, sputtering, or CVD. Rapid thermal annealing (RTA) is then carried out under conditions wherein the metal reacts with exposed silicon to form a metal silicide. RTA induces chemical reactions and phase changes while avoiding prolonged heating of the substrate. Appropriate temperatures and heating times depend on the type of silicide being formed. A second RTA is often is employed to obtain the silicide in a desired, low resistivity phase. After the first or second RTA, un-reacted metal is removed by washing with an acid solution or another suitable technique.

Any suitable metal can be employed, including metals of Group IV-A, V-A, and VIII. Specific examples include Pt, Ru, Ti, Ni, and Co. Preferably, the metal is Co. Generally, the silicide is formed with an RTA in the range from about 600 to about 800° C. Higher temperatures processes that could affect the silicide are generally completed before silicide formation. For example, gate oxides are generally formed for peripheral region transistors prior to saliciding. The second poly layer can serve to cover and protect peripheral region gate oxides, as well as the interpoly dielectric, during saliciding.

Saliciding gives the bit lines a low sheet resistance. In one embodiment, the sheet resistance for the bit lines is no more than about 100 ohms/square. In another embodiment, the sheet resistance is no more than about 20 ohms/square. In a further embodiment, the sheet resistance is no more than about 4 ohms/square.

After implanting the source/drain regions, but prior to saliciding, it may be desirable to form spacers adjacent the memory cell stacks. Spacers can be formed by depositing a dielectric and then etching to remove most of it. The spacers are generally no more than about 200 Å wide.

After saliciding, act 119 covers the core region with a dielectric coating. The dielectric serves to fill the gaps between memory cell stacks. Typically, the dielectric is an oxide, such as silicon dioxide or TEOS.

Figure 12:
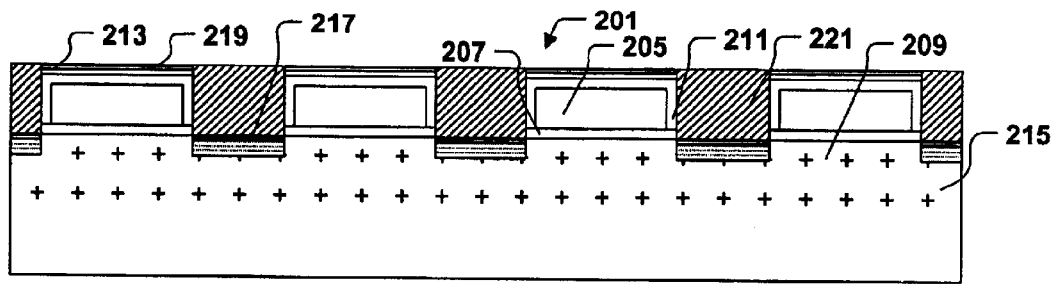
FIG. 12 is a cross-sectional schematic illustration of FIG. 9's core region after depositing a dielectric and polishing.

Act 121 is polishing the surface to expose the silicide 219 of the second poly layer 213 over the memory cells stacks. The result is illustrated in FIG. 12, where the dielectric 221 fills the gaps between memory cell stacks. Polishing can be carried out be any suitable process, such as chemical mechanical polishing (CMP).

After the second poly layer silicide 219 is exposed, act 123 forms a third poly layer. Word lines will be formed from the third poly layer. Accordingly, the third poly layer is relatively thick. In one embodiment, the third poly layer has a thickness of about 500 Å to about 6000 Å. In another embodiment, the third poly layer has a thickness of about 750 Å to about 3000 Å. In a further embodiment, the third poly layer has a thickness of about 1,000 Å to about 1,500 Å. The salicide on the second poly layer can facilitate contact with the third poly layer, thereby reducing contact resistance.

Figure 13:
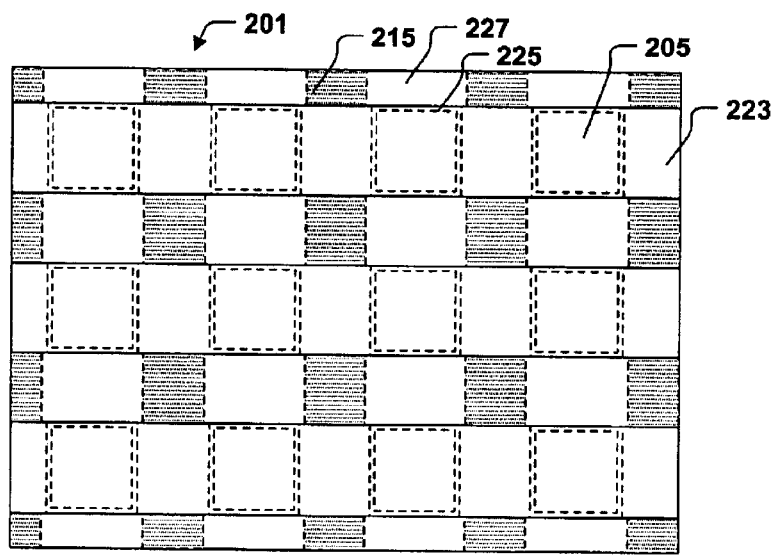
FIG. 13 a schematic illustration of the substrate of FIG. 9 after patterning word lines.
Figure 14:
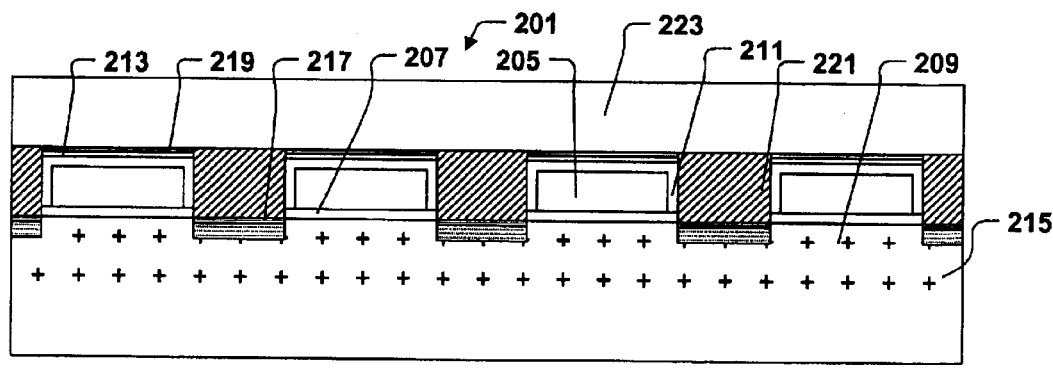
FIG. 14 is a cross-sectional schematic illustration of FIG. 13's core region.

Act 125 patterns the third poly layer to form word lines. A typical pattern is illustrated for core region 201 in FIGS. 13 and 14. As part of the patterning process, the second poly layer 213 between word lines 223 is etched to divide the second poly layer 213 into control gates 225. Word lines 223 connect groups of the control gates 225, for example, in rows running perpendicular to the bit lines 215. Within regions 227, which lie between word lines 223 and bit lines 215, the stack is etched at least down to a dielectric layer.

The word lines can be relatively narrow. In one embodiment, the word lines are from about 0.12 to about 0.28 μm wide. In another embodiment, the word lines are from about 0.16 to about 0.24 μm wide. In a further embodiment, the word lines are from about 0.18 to about 0.22 μm wide.

The spaces between word lines can be smaller than the word lines. In one embodiment, the spaces between word lines are from about 0.04 to about 0.28 μm. In another embodiment, the spaces between word lines are from about 0.05 to about 0.14 μm. In a further embodiment, the spaces between word lines are from about 0.06 to about 0.08 μm. In a still further embodiment, the word lines are at least about 50% wider than the spaces between word lines.

The spaces between word lines can be smaller than the resolution of the lithography process used in word line patterning. One technique for reducing the size of these spaces involves forming spacers around a patterned resist prior to etching. Another technique involves trimming a patterned first resist and then forming a second resist into the negative image of the first resist.

The present invention allows for compact cells. In one embodiment, the average cell area is no more than about $0.20\ \mu m^2$. In another embodiment, the average cell area is no more than about $0.13\ \mu m^2$. In a further embodiment, the average cell area is no more than about $0.086\ \mu m^2$.

Although the invention has been shown and described with respect to certain embodiments, alterations and modifications providing equivalent structures and acts are likely to occur to those of ordinary skill in the art upon the reading and understanding this specification and the associated drawings. Such alterations and modifications are intended to fall within the scope of the present invention, unless expressly stated to the contrary. Components described in functional terms have structure and involve acts, unless otherwise indicated, corresponding to any of the devices and methods known to those of ordinary skill in the art to perform those functions, even though not equivalent to any of the structures and acts that perform those function in the exemplary embodiments of the invention. In addition, while a particular feature of the invention may have been disclosed with respect to only one of several embodiments, such feature may be combined with one or more other features of the other embodiments as may be desired or advantageous for a given or particular application.

What is claimed is:

1. A process for forming a virtual ground array flash memory device, comprising:

providing a semiconductor substrate having a core region;

forming a tunnel oxide in the core region;

forming a first poly layer over the tunnel oxide;

patterning the first poly layer to form isolated floating gates;

forming an interpoly dielectric layer over the floating gates;

forming a second poly layer over the interpoly dielectric;

patterning at least the second poly layer and the interpoly dielectric to expose the substrate along locations for buried bit lines;

implanting the substrate to form buried bit lines;

saliciding the bit lines and the second poly layer;

depositing a third poly layer over the second poly layer; and patterning the third poly layer to form word lines and the second poly layer to electrically isolate the word lines.

2. The process of claim 1, further comprising:

after saliciding, depositing a gap-filing dielectric over the core region; and polishing to expose a portion of the second poly layer.

3. The process of claim 1, further comprising forming spacers in the core region after implanting the substrate to form buried bit lines, but before saliciding.

4. The process of claim 1, further comprising:

forming a gate oxide in the peripheral region;

wherein the second poly layer covers the gate oxide.

5. The process of claim 1, wherein the flash memory device has an average cell area of no more than about $0.13\ \mu m^2$.

6. The process of claim 1, wherein the first poly layer has a thickness less than about 800 Å.

7. The process of claim 1, wherein saliciding forms a Co salicide.

8. The process of claim 1, wherein the tunnel oxide is a high-k dielectric.

9. The process of claim 1, wherein patterning the third poly layer provides word lines that are wider than a spacing between the word lines.

10. The process of claim 9, wherein the word lines are at least about 50% wider than the spacing between the word lines.

11. The process of claim 1, wherein forming the interpoly dielectric layer further comprises forming the interpoly dielectric layer on a top and sides of the floating gates subsequent to patterning the first poly layer.

12. The process of claim 11, further comprising forming spacers on the sides of the floating gates prior to forming the interpoly dielectric layer.

13. The process of claim 1, wherein patterning the first poly layer to form isolated floating gates comprises patterning the first poly layer to form a plurality of generally square portions in a grid arrangement.

* * * * *

UNITED STATES PATENT AND TRADEMARK OFFICE
CERTIFICATE OF CORRECTION

PATENT NO.   : 6,716,698 B1
DATED        : April 6, 2004
INVENTOR(S)  : Yue-song He, Richard Fastow and Wei Zheng It is certified that error appears in the above-identified patent and that said Letters Patent is hereby corrected as shown below:

<u>Column 6,</u>
Line 18, please replace the number "0.1" with the number -- 0.11 --.

Signed and Sealed this

Twenty-third Day of November, 2004

JON W. DUDAS
*Director of the United States Patent and Trademark Office*